United States Patent [19]

Nakanishi

[11] Patent Number: 5,473,189

[45] Date of Patent: Dec. 5, 1995

[54] LEAD FRAME FOR A SEMICONDUCTOR INTEGRATED CIRCUIT WITH OUTER LEADS HAVING A STAGGERED CONFIGURATION

[75] Inventor: Hiroyuki Nakanishi, Tenri, Japan

[73] Assignee: Sharp Kabushiki Kaisha, Osaka, Japan

[21] Appl. No.: 317,851

[22] Filed: Oct. 4, 1994

[30]     Foreign Application Priority Data

Oct. 4, 1993   [JP]   Japan ..................................... 5-247827

[51] Int. Cl.$^6$ .................................................. H01L 23/48
[52] U.S. Cl. ........................... 257/670; 257/666; 257/667
[58] Field of Search .................................... 257/670, 666, 257/667

[56]                     References Cited

FOREIGN PATENT DOCUMENTS

60-42852   3/1985   Japan .
  2244750    9/1990   Japan .

*Primary Examiner*—Jerome Jackson
*Assistant Examiner*—Nathan K. Kelley
*Attorney, Agent, or Firm*—Nixon & Vanderhye

[57]                         ABSTRACT

A lead frame for a semiconductor integrated circuit has a chip mounting section for carrying a semiconductor chip and a peripheral section where a plurality of outer leads are juxtaposed with each other. The semiconductor chip will be sealed by a sealing resin when mounted on said chip mounting section. The outer leads extend outwardly from the chip mounting section and are adapted to electrically connected with the semiconductor ship mounted. Each outer lead has a first offset portion which is spaced more from a first adjacent outer lead on one side thereof than from a second adjacent outer lead on the other side thereof and a second offset portion which is spaced more from the second adjacent outer lead than from the first adjacent outer lead. The first and second offset portions of each outer lead is arranged in a staggered pattern. Dam bars are interposed between the adjacent outer leads in a manner connecting each outer lead with the first adjacent outer lead at the first offset portion and with the second adjacent outer lead at the second offset portion for damming off the sealing resin that flows over the chip mounting section when the semiconductor chip is sealed.

4 Claims, 9 Drawing Sheets

LEAD FRAME FOR A SEMICONDUCTOR INTEGRATED CIRCUIT WITH OUTER LEADS HAVING A STAGGERED CONFIGURATION

BACKGROUND OF THE INVENTION

1. Field of the Invention

The present invention relates to a semiconductor integrated circuit lead frame which is to be mounted with a semiconductor chip and molded with a sealing resin.

2. Description of the Prior Art

Figure 5:
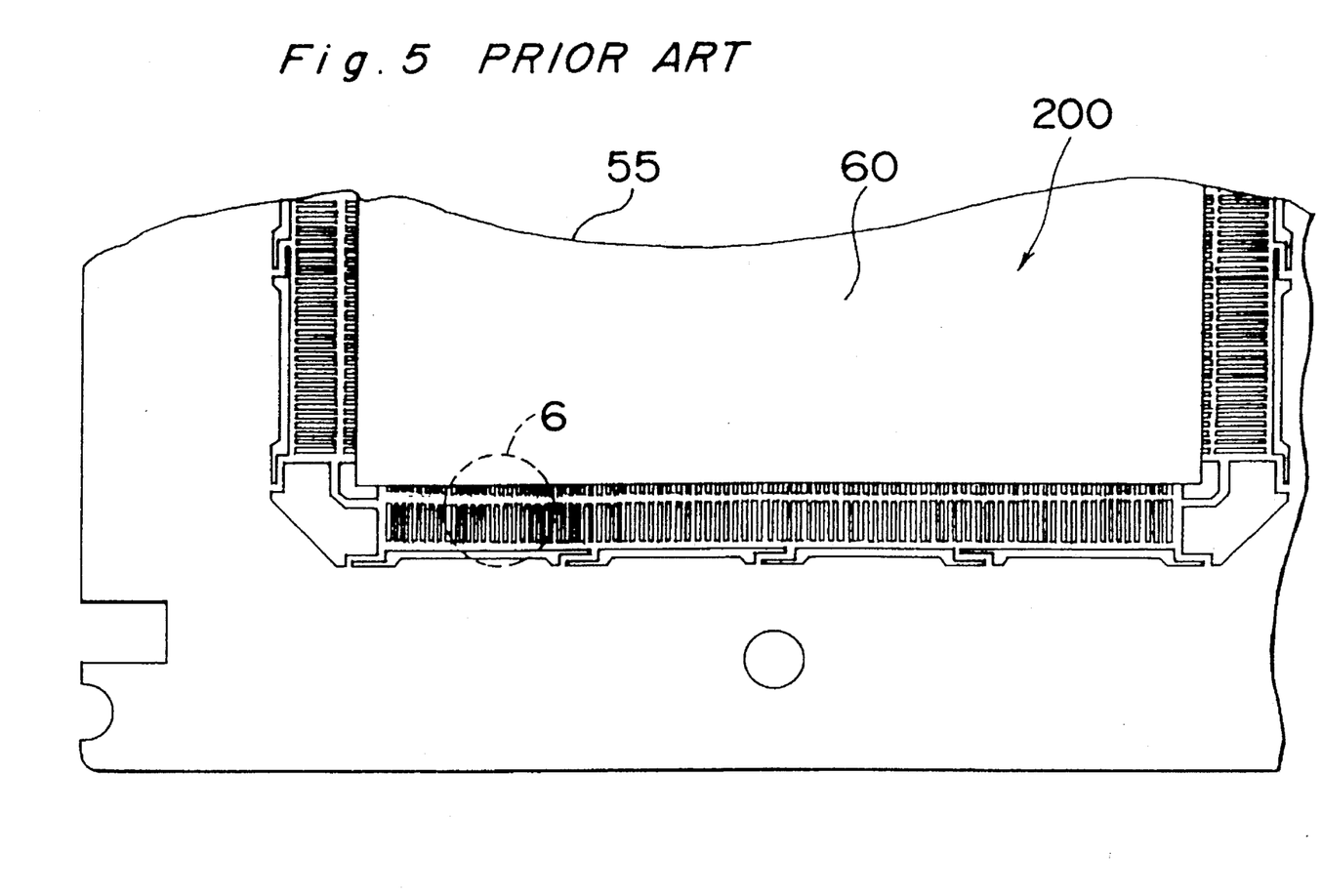
FIG. 5 is a plan view of a part of a conventional semiconductor integrated circuit lead frame in a state immediately after a semiconductor chip is sealed with a sealing resin.

FIG. 5 shows a conventional semiconductor integrated circuit lead frame of the above-mentioned type. A portion encircled by the dotted line in FIG. 5 and designated by numeral 6 is shown on a magnified scale in FIG. 6. A lead frame 200 has a chip mounting section 55 to be mounted with a semiconductor chip and a plurality of straight outer leads 56, 56, . . . which extend outwardly from the chip mounting section 55. A semiconductor chip mounted on the chip mounting section 55 is sealed with a sealing resin 60. The outer leads 56 are adapted to be electrically connected to the semiconductor chip.

Figure 7:
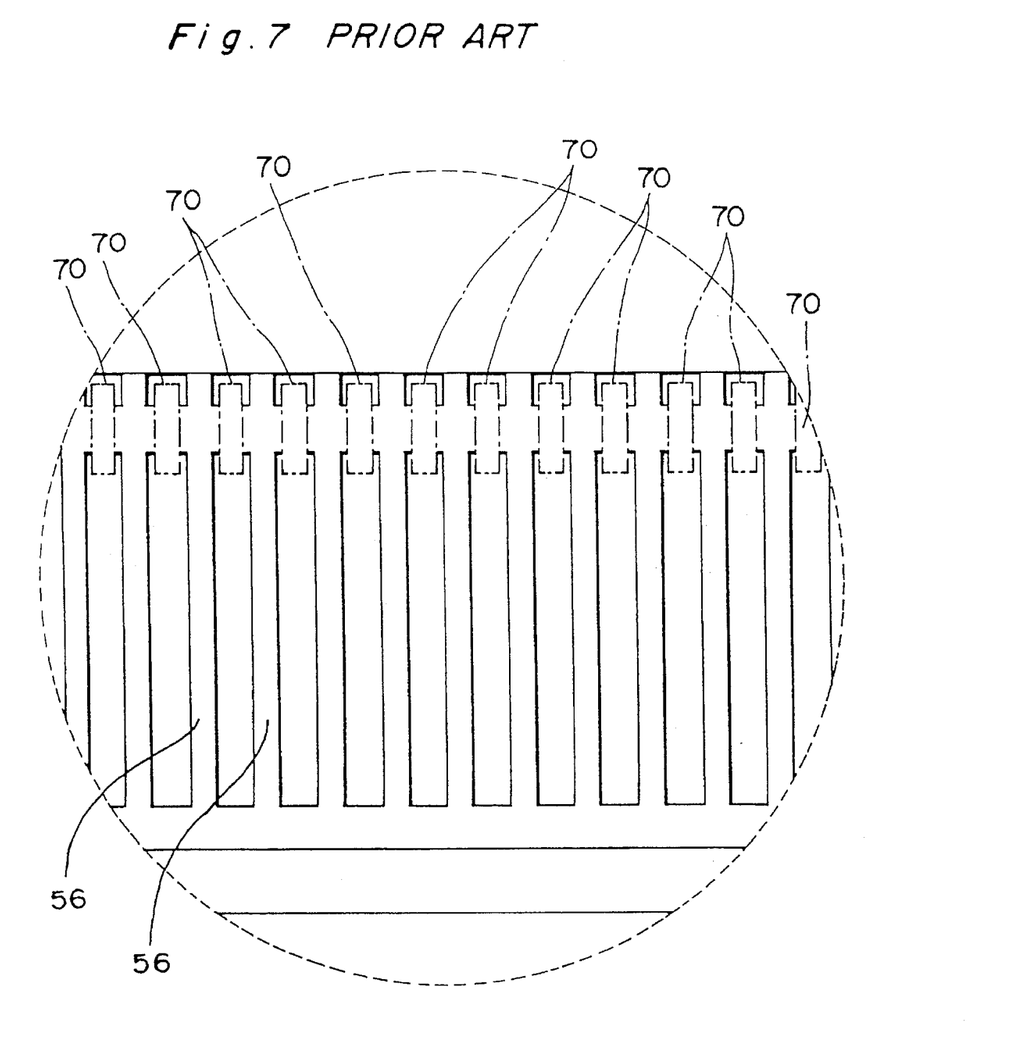
FIG. 7 illustrates regions to be punched out in the dam bars of FIG. 6.
Figure 8:
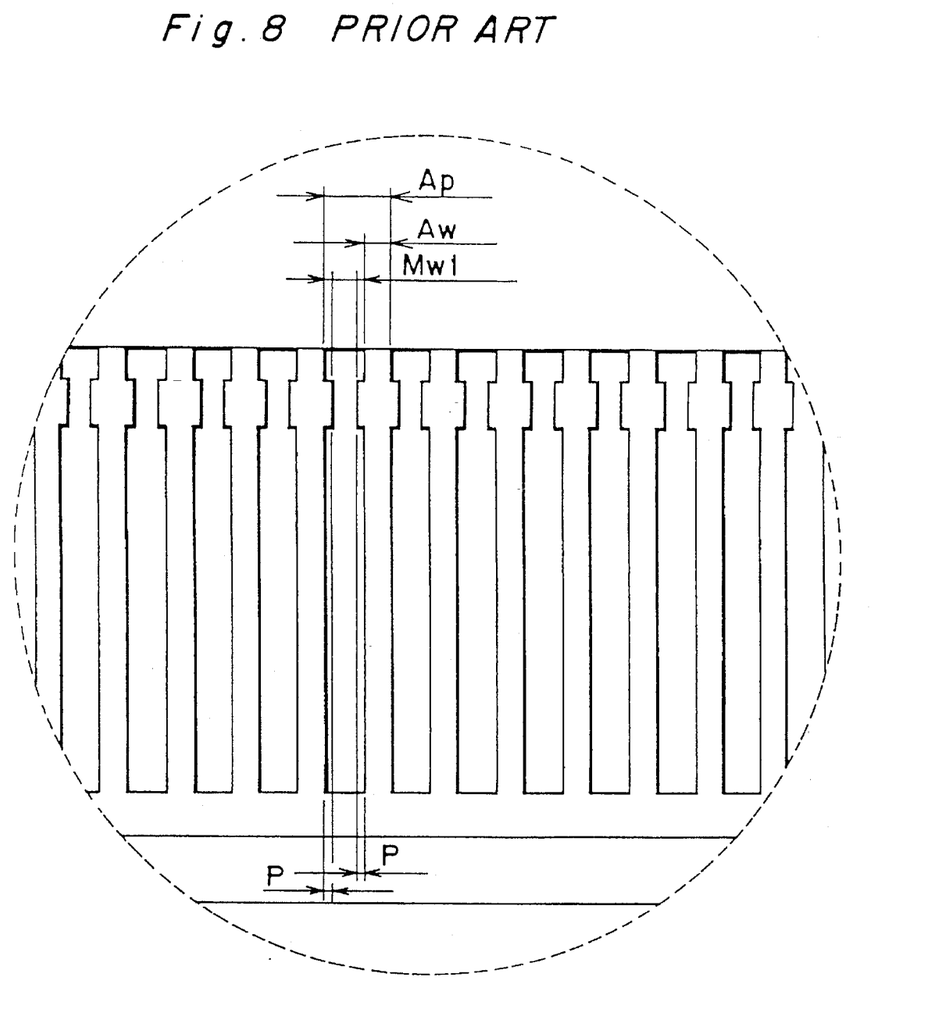
FIG. 8 illustrates the encircled part in a state that the dam bars have been already punched, to explain the dimensions of essential parts in the conventional lead frame.

The lead frame 200 further includes a plurality of dam bars 52 which are aligned in a direction perpendicular to the direction in which the outer leads 56 and 56 extend, and connect the adjacent outer leads 56. The dam bars 52 serve to dam off an excess sealing resin flowing over the chip mounting section 55 and leaking in between the outer leads 56 and 56 when the semiconductor chip is sealed with the sealing resin 60 on the chip mounting section 55. When the sealing resin 60 is solidified, the dam bars 52 have completed their duties, and therefore punching regions 70 of the dam bars 52, which are shown in FIG. 7, are punched out to disconnect the outer leads 56 from each other.

Figure 6:
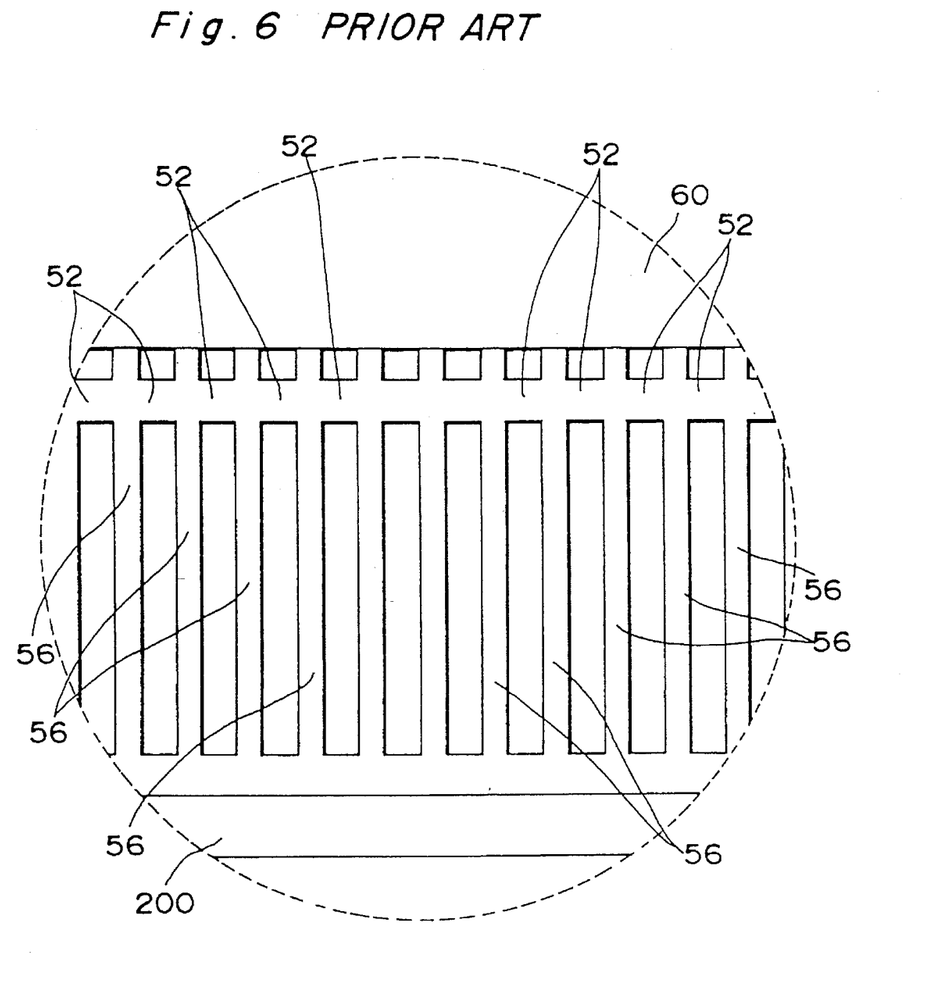
FIG. 6 is an enlarged plan view of an encircled part 6 of FIG. 5.
Figure 9:
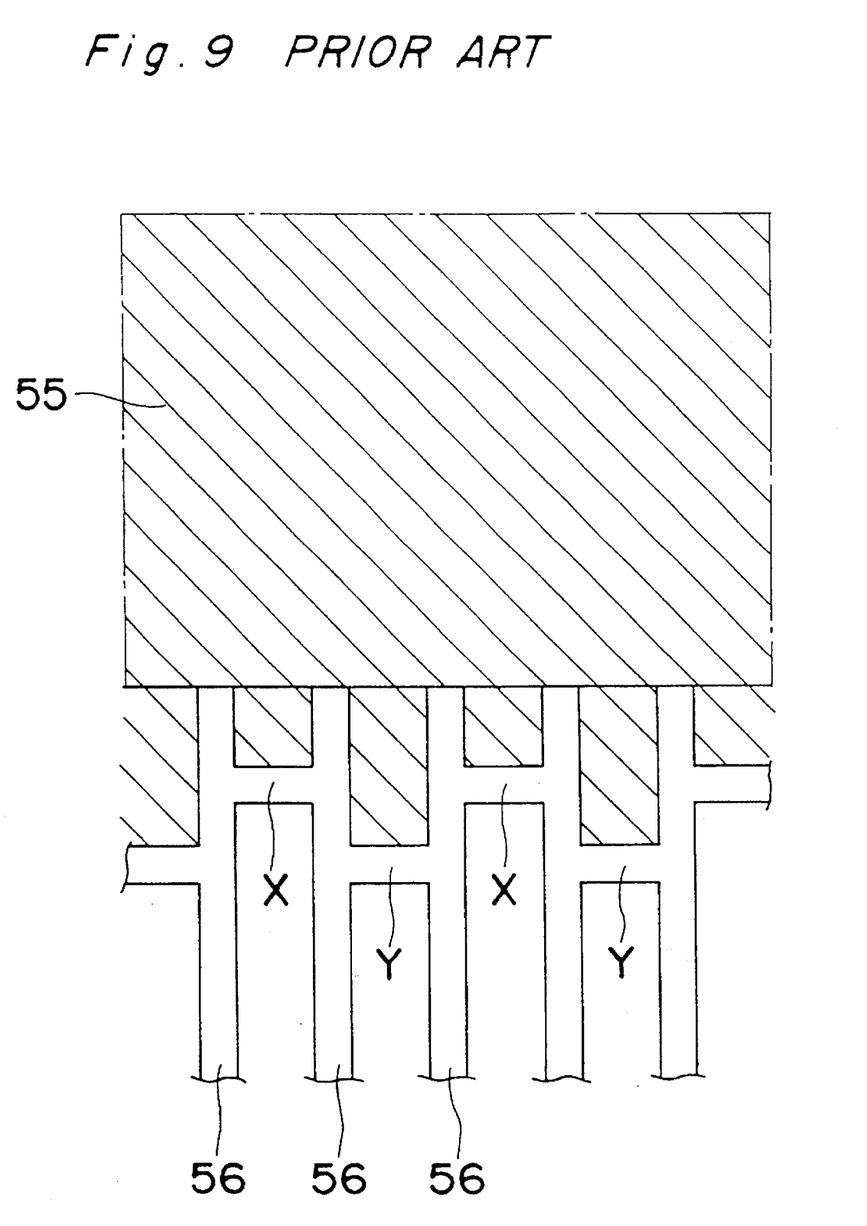
FIG. 9 illustrates a further conventional semiconductor integrated circuit lead frame.

FIG. 9 shows a further prior art lead frame which is disclosed in Japanese Patent Laid-open Application No. 2-244750 (published in 1990). Note that in FIG. 9, parts similar to those in FIGS. 5–7 are indicated by the same reference numerals. In the lead frame of FIG. 9, alternate dam bars (tiebars), indicated by reference characters X and Y, are formed in different positions and connect the adjacent straight outer leads (external leads) 56 which extend outwardly from the chip mounting section (resin mold section) 55.

In accordance with the recent trend of increasing the integration or packing density of semiconductor integrated circuits and enhancing the function of each semiconductor chip, the pitch of the outer leads is being subject to reduction.

In the above-described prior art lead frames, according as the pitch of the outer leads 56 is reduced, the size of the dam bar 52, X, Y is necessarily reduced. In practice, when the outer lead pitch is 0.5 mm, the outer lead width is 0.2 mm and the inter-lead dimension of the dam bar provided between the outer leads is 0.3 mm according to EIAJ (Electronic Industries Association of Japan). A die for punching the dam bars of 0.3 mm is required to be designed to have a blade width of 0.24 mm when a tolerance in positioning the blades is ±30 μm. When the outer lead pitch is further reduced to 0.3 mm, the outer lead width is 0.12 mm and the inter-lead dimension of the dam bar provided between the adjacent outer leads is 0.18 mm according to the EIAJ. Then, a die for punching the dam bars of 0.18 mm is required to be designed to have a blade width of 0.12 mm when a tolerance in positioning the blades is ±30 μm. As obvious from the above, when the outer lead pitch is reduced from 0.5 mm to 0.3 mm, the blade width of the die for punching the dam bars is required to be reduced to one half so long as the fabrication technique and the assembling technique are on the same levels. The blade pitch is also reduced.

Unfortunately, according as the blade width is reduced, the abrasion resistance of the blades is deteriorated and the wearing speed of the blades is increased. This results in an increased rate of occurrence of damages. Furthermore, according as the blade width and the blade pitch are reduced, it is getting more difficult to position the blades, i.e., to align the blades with the dam bars, with precision in the punching process of the dam bars.

SUMMARY OF THE INVENTION

The object of the present invention is therefore to provide a lead frame for a semiconductor integrated circuit capable of restraining reduction of the dimensions of the dam bars disposed between the outer leads so as to facilitate easy removal of the dam bars even when the outer lead pitch is reduced with an increase in integration density of the semiconductor integrated circuit.

A lead frame for a semiconductor integrated circuit according to the present invention has a chip mounting section for carrying a semiconductor chip and a peripheral section where a plurality of outer leads are juxtaposed with each other. The semiconductor chip will be sealed by a sealing resin when mounted on said chip mounting section. The outer leads extend outwardly from the chip mounting section and are adapted to electrically connected with the semiconductor ship mounted.

Each outer lead has a first offset portion which is spaced more from a first adjacent outer lead on one side thereof than from a second adjacent outer lead on the other side thereof and a second offset portion which is spaced more from the second adjacent outer lead than from the first adjacent outer lead. In other words, at the first offset portion of one outer lead a distance between the one outer lead and its first adjacent outer lead is larger than a distance between the one outer lead and its second adjacent outer lead, and at the second offset portion of the one outer lead a distance between the one outer lead and its second adjacent outer lead is larger than a distance between the one outer lead and its first adjacent outer lead. The first and second offset portions of each outer lead is arranged in a staggered pattern.

Dam bars are interposed between the adjacent outer leads in a manner connecting each outer lead with the first adjacent outer lead at the first offset portion of the former outer lead and with the second adjacent outer lead at the second offset portion of the outer lead for damming off the sealing resin that flows over the chip mounting section when the semiconductor chip is sealed.

According to the present invention, due to the configuration of each outer lead having the first and second offset portions, a space having a width larger than the outer lead pitch is achieved between the adjacent outer leads. The dam bar is provided in such a wide space. As a result, the width of the dam bar disposed between the adjacent outer leads in the lead frame of the present invention becomes larger than that of the dam bar in the prior art lead frame.

Therefore, according to the present invention, the widths of the dam bars and hence the widths of the blades for cutting the dam bars are prevented from being reduced even when the outer lead pitch is reduced due to the increased integration density. As a result, even if the outer lead pitch is reduced, the blade is prevented from having a shortened life, a margin in the blade positioning accuracy is produced, and eventually the manufacturing cost can be reduced.

BRIEF DESCRIPTION OF THE DRAWINGS

The present invention more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes the present invention based on an embodiment with reference to the attached drawings.

Figure 1:
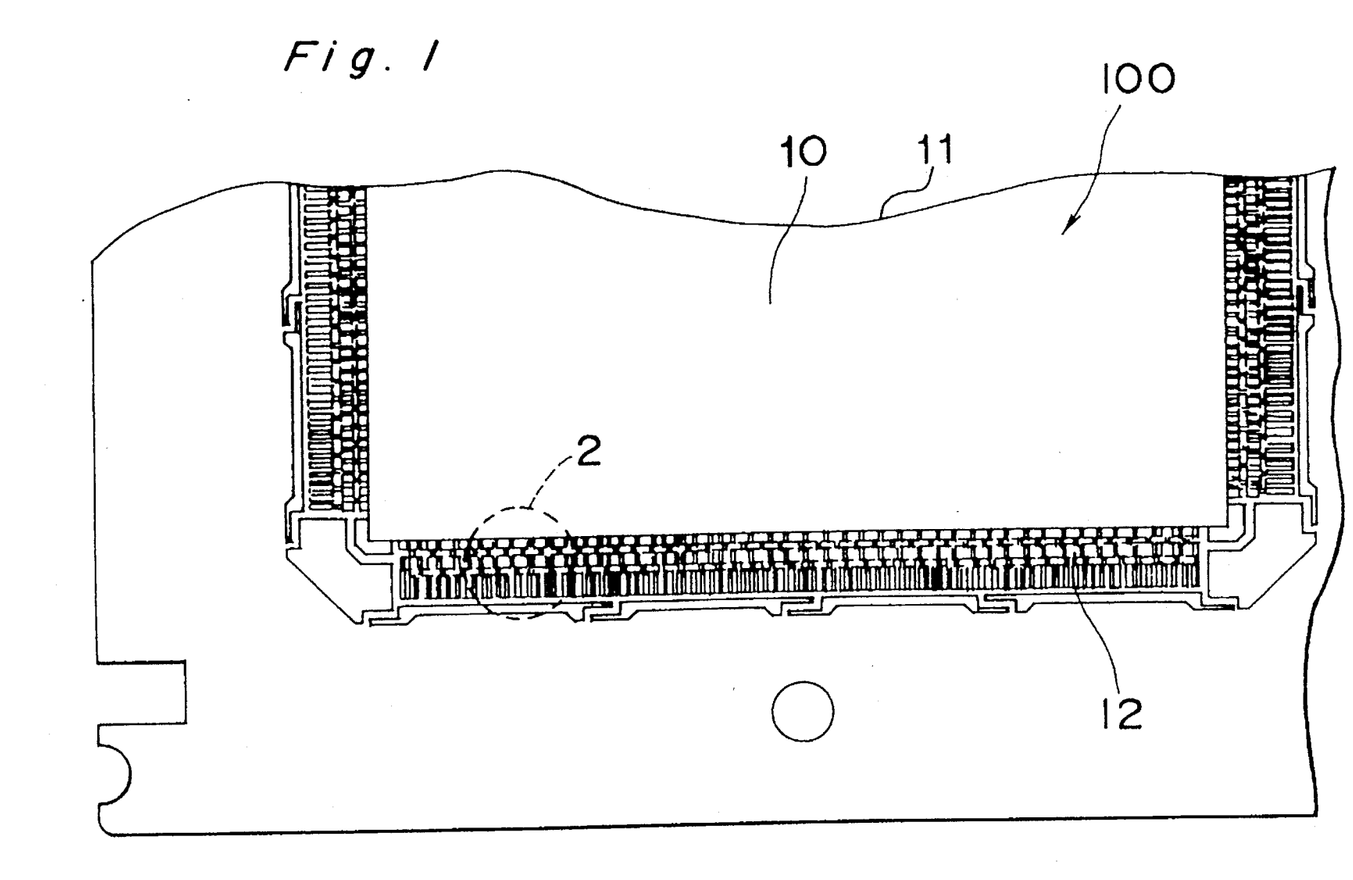
FIG. 1 is a plan view of a part of a semiconductor integrated circuit lead frame in accordance with an embodiment of the present invention that is in a state immediately after a semiconductor chip is sealed with a sealing resin.

FIG. 1 shows a semiconductor integrated circuit lead frame of an embodiment of the present invention which is in a state immediately after a semiconductor chip mounted is sealed with a sealing resin. A portion 2 encircled by the dotted line in FIG. 1 is shown on an enlarged scale in FIG. 2.

A lead frame 100 of the present embodiment is provided with a chip mounting section 11, on which a semiconductor chip is mounted, in its central part. The chip mounting section 11 mounted with a semiconductor chip is molded with a sealing resin 10.

Figure 2:
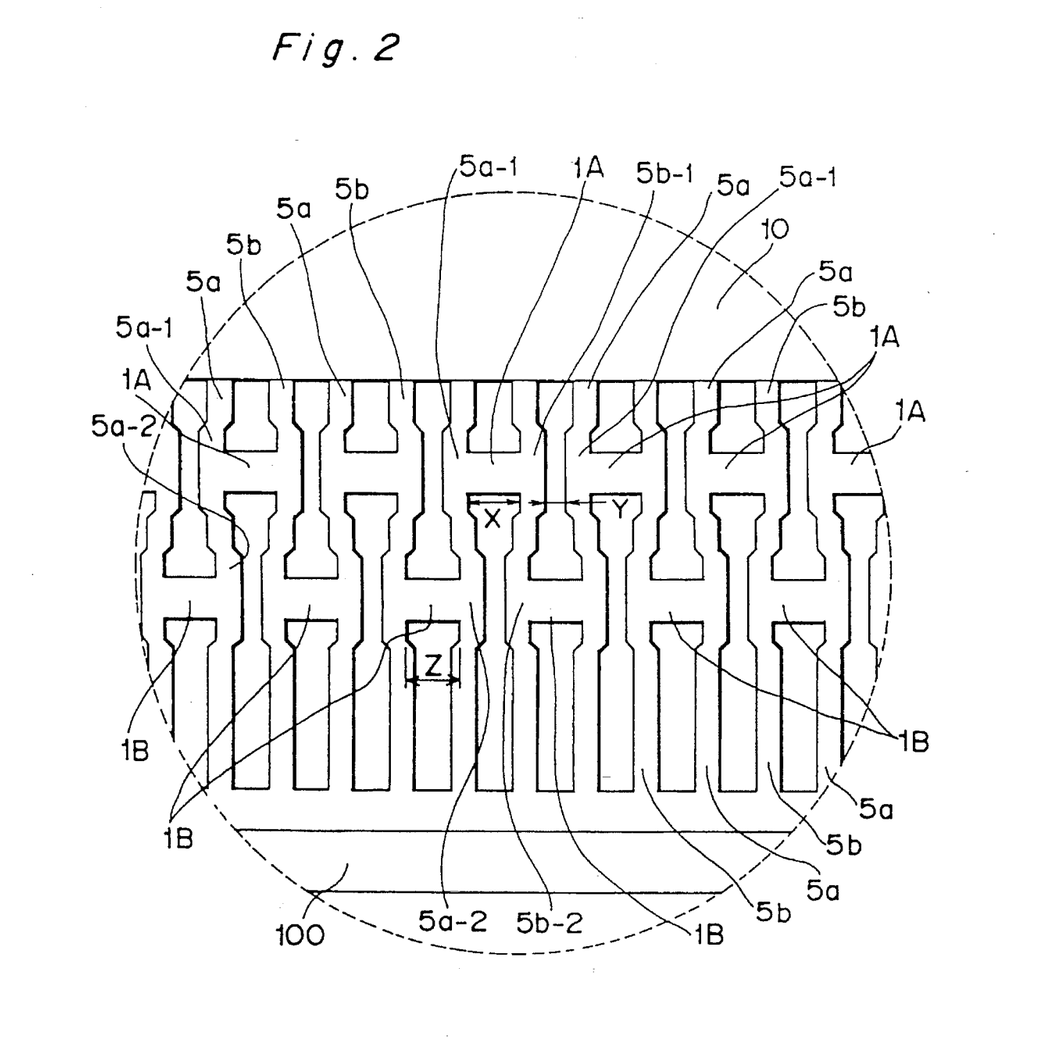
FIG. 2 is an enlarged plan view of an encircled part 2 of FIG. 1, showing dam bars arranged in a staggered pattern.

As shown in FIG. 2, the lead frame 100 has, in its periphery 12, a plurality of outer leads 5a, 5b, 5a, 5b, . . . which extend outwardly from the chip mounting section 11. The outer leads 5a and the outer leads 5b are arranged alternately.

As shown in FIG. 2, each outer lead 5a has a zigzag or staggered configuration including a rightward offset portion 5a-2 and a leftward offset portion 5a-1, and each outer lead 5b also has a zigzag or staggered configuration including a rightward offset portion 5b-1 and a leftward offset portion 5b-2. The outer lead 5a has the leftward offset portion 5a-1 in a first position of the lead frame periphery 12 closer to the chip mounting section 11, and the rightward offset portion 5a-2 in a second position of the lead frame periphery 12 farther away from the chip mounting section 11 than the first position. On the other hand, the outer lead 5b has the rightward offset portion 5b-1 in the first position and the leftward offset portion 5b-2 in the second position.

The offset portions 5a-1 of the outer leads 5a are opposed to the offset portions 5b-1 of the outer leads 5b, while the offset portions 5a-2 of the outer leads 5a are opposed to the offset portions 5b-2 of the outer leads 5b.

Due to the patterns of the outer leads 5a and 5b, a distance X between the rightward offset portion 5b-1 of the outer lead 5b and the leftward offset portion 5a-1 of one adjacent outer lead 5a disposed on the immediately left-hand side of the outer lead 5b is greater than a distance Y between the rightward offset portion 5b-1 of the outer lead 5b and the leftward offset portion 5a-1 of the other adjacent outer lead 5a disposed on the immediately right-hand side of the outer lead 5b. The distance X is larger than a pitch of the outer leads 5a, 5b and is also a maximum distance between the outer lead 5a and the outer lead 5b.

The lead frame 100 of this embodiment further includes dam bars 1A, 1B which connect the outer leads 5a with the outer leads 5b and which extend in a direction perpendicular to the direction in which the outer leads 5a and 5b extend. Each dam bar 1A is provided in the first position of the lead frame periphery 12 and connect the leftward offset portion 5a-1 of the outer lead 5a with the rightward offset portion 5b-1 of the outer lead 5b spaced from the former offset portion 5a-1 by the maximum distance X. In other words, the dam bars 1A are provided in areas having a width of the maximum distance X between the outer leads 5a and the outer leads 5b.

The dam bars 1B are positioned in the second position of the lead frame periphery 12 and connect the leftward offset portions 5b-2 of the outer leads 5b with the rightward offset portions 5a-2 of the outer leads 5a spaced from the former offset portions 5b-2 by the maximum distance of X. In other words, similar to the dam bars 1A, the dam bars 1B are provided in areas having a width of the maximum distance X between the outer leads 5a and the outer leads 5b.

Figure 3:
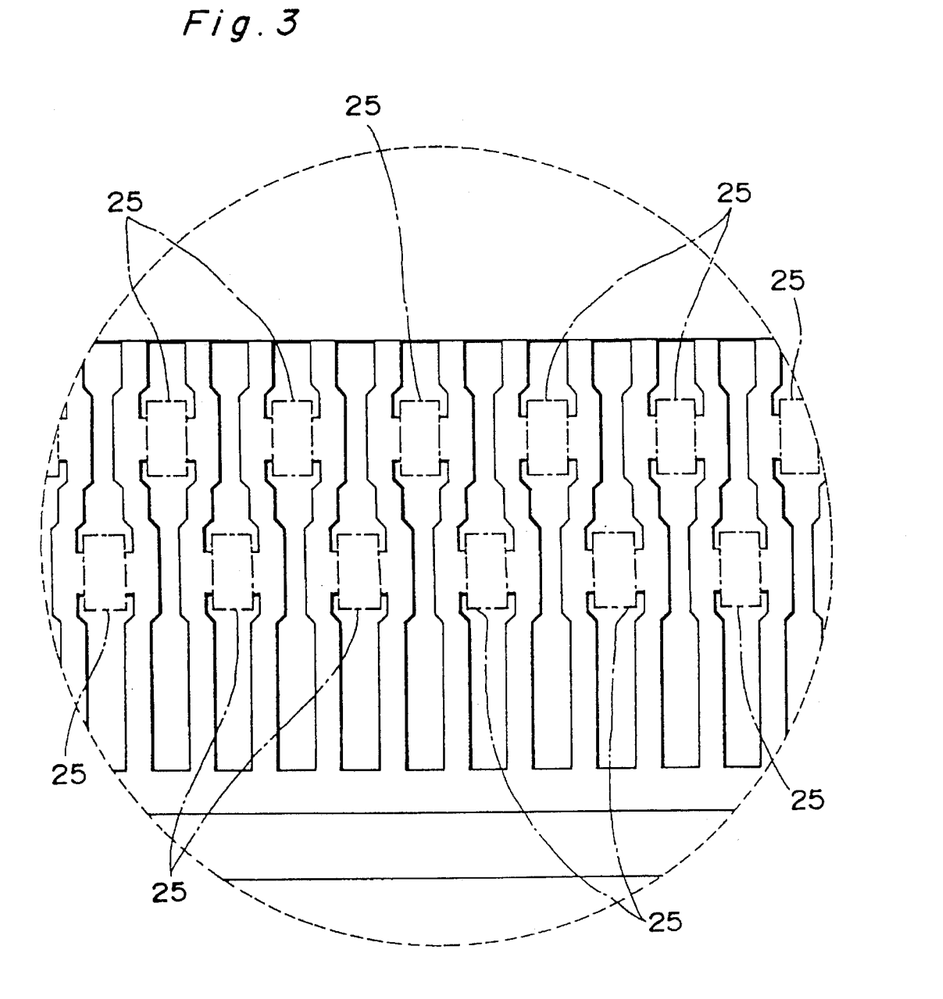
FIG. 3 illustrates regions to be punched out in the dam bars of FIG. 2.
Figure 4:
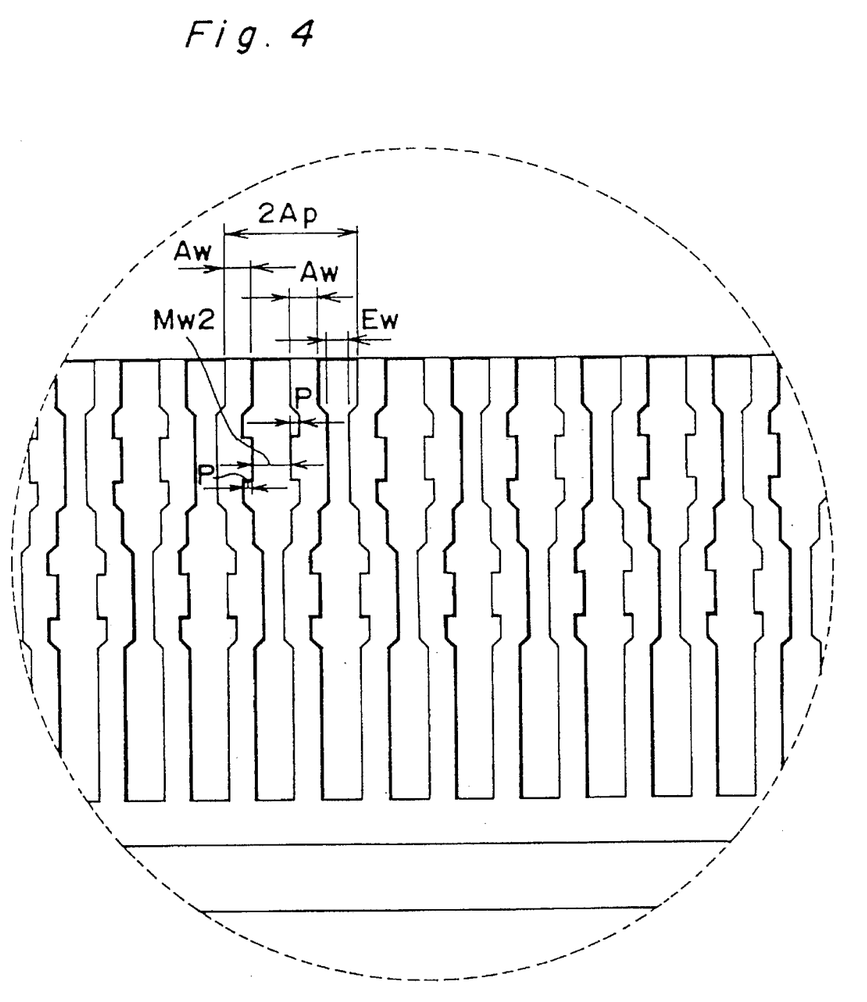
FIG. 4 illustrates the encircled part 2 of FIG. 1 in a state that the dam bars have been already punched, to explain the dimensions of essential parts in the embodiment.

The dam bars 1A and 1B serve to dam off sealing resin 10 overflowing the chip mounting section 11 in the later molding process to prevent the sealing resin 10 from leaking from between the outer leads 5a and the outer leads 5b. It should be noted that the dam bars 1A and 1B electrically connect the outer leads 5a, 5b with each other, and therefore the dam bars must be removed after the sealing resin 10 is solidified, so that the outer leads are electrically disconnected from each other. FIG. 3 shows portions 25 to be punched in the dam bars 1A and 1B.

In the lead frame 100 as described above, each dam bar 1A is provided in the area having a width of the maximum distance X between the outer leads 5a and 5b in the first position of the lead frame periphery 12, and each dam bar 1B is provided in the area also having a width of the maximum distance X between the outer leads 5a and 5b in the second position of the lead frame periphery.

With the above-mentioned arrangement, a dimension Z of the dam bars 1A and 1B between the outer leads 5a and the outer leads 5b can be set at the maximum distance X. Therefore, according to the present embodiment, the dam bars 1A and 1B are able to have an increased dimension in comparison with the dimension achieved in the conventional example in which the dam bars are arranged in a straight line configuration. Therefore, according to the present embodiment, the dimensions of the dam bars 1A and 1B which connect the outer leads 5a, 5b with each other can be prevented from being reduced even when the semiconductor integrated circuit has an increased density with reduction of the outer lead pitch. Therefore, the blade width of the blades for punching the portions 25 of the dam bars 1A and 1B is not required to be reduced as much as required in the conventional example. This can suppress the reduction of lifetime of the blades and produces a margin in the blade positioning accuracy. As a result, the blades can be readily worked and the manufacturing cost can be therefore reduced.

The following describes in detail the aforementioned advantage with reference to FIGS. 3 and 6.

Assuming that the outer lead pitch is Ap, that the outer lead width is Aw, that the dam bar dimension (width) is Dw, that the blade width of the dam bar punching die is Mw2, that a tolerance in aligning or positioning the punching die is P, and that a minimum etching width is Ew, the following Equation (1) holds.

$$2Ap = Mw2 + 2Aw + 2P + Ew \quad (1)$$

Then, from Equation (1), the following Equation (2) is obtained.

$$Mw2 = 2Ap - 2Aw - 2P - Ew \quad (2)$$

Meanwhile, in the case of the conventional example shown in FIG. 6, assuming that the outer lead pitch is Ap, that the outer lead width is Aw, that the dam bar width is Dw, that the blade width of the dam bar punching die is Mw1, and that the tolerance in aligning the punching die is P, the following Equations (3) and (4) hold.

$$Dw = Ap - Aw \quad (3)$$

$$Mw1 = Dw - 2P = Ap - Aw - 2P \quad (4)$$

In more detail, the blade width of the dam bar punching die is Mw2 expressed by Equation (2) in the present embodiment, while the blade width of the dam bar punching die is Mw1 expressed by Equation (4) in the conventional example. Therefore, when Mw2−Mw1>0, the blade width of the dam bar punching die in the present embodiment can be made larger than the blade width of the dam bar punching die in the conventional example.

From Equations (1) and (4), the following Equation (5) is obtained:

$$Mw2 - Mw1 = Ap - Aw - Ew \quad (5)$$

Therefore, to make positive the value of (Mw2−Mw1), the following equation is required to be satisfied.

$$Ap - Aw > Ew$$

In practice, when the outer lead pitch Ap is 0.3 mm and the outer lead width Aw is 0.12 mm, (Ap−Aw) equals 0.18 mm. Therefore, by reducing the minimum etching width Ew in this embodiment to a value less than 0.18 mm, the blade width of the punching die can be made greater than the blade width required in the conventional example. For instance, when Ew=0.10 mm, the blade widths Mw2 and Mw1 of the punching die for use in this embodiment and in the conventional example are expressed by the following Equations (6) and (7) respectively:

$$
\begin{aligned}
Mw2 &= 2(0.3\,\mathrm{mm} - 0.12\,\mathrm{mm} - P) - 0.10\,\mathrm{mm} \quad (6)\\
&= 0.26\,\mathrm{mm} - 2P\\
Mw1 &= 0.3\,\mathrm{mm} - 0.12\,\mathrm{mm} - 2P \quad (7)\\
&= 0.18\,\mathrm{mm} - 2P
\end{aligned}
$$

Then, from Equations (6) and (7), the following Equation (8) expressing a ratio of Mw1 to Mw2 is obtained.

$$
\begin{aligned}
Mw1/Mw2 &= (0.18 - 2P)/(0.26 - 2P) \quad (8)\\
&= 1 - \{0.08/(0.26 - 2P)\}
\end{aligned}
$$

As is evident from Equation (8), according as the tolerance P in aligning the punching die with the dam bar is reduced in the range of $0 \leq P < 0.09$, the value of Mw1/Mw2 approaches 0. This means that according as the tolerance P is reduced in the range of $0 \leq P < 0.09$, the blade width Mw2 of the die for the present embodiment can be increased, as compared with the blade width Mw1 of the die for the conventional example.

For instance, assuming that the aforementioned tolerance P is 0.03 mm (30 μm) and substituting the value into Equation (8), the value of Mw1/Mw2 is 0.6. Accordingly, the blade width Mw2 of the punching die for the present embodiment is about 1.67 times as great as the blade width Mw1 of the punching die for the conventional example. Therefore, according to the invention, the life of the blade of the punching die can be increased. In more detail, when P=0.03 mm, Mw2=0.20 mm and Mw1=0.12 mm. Then, the life of the blade (which is represented by the number of shots made until the edge of the blade is worn out and rounded to be unusable) is 1 to 2 million shots for the blade width Mw2 of 0.20 mm and 0.1 to 0.5 million shots for the blade width Mw1 of 0.12 mm. Thus, it can be said that the present invention is very effective in achieving a long life of the blades.

The blade width Mw2 may be less than 1.67 time as great as the blade width Mw1 such that the tolerance in aligning the blade of the die with the dam bar is increased accordingly. More specifically, as is evident from the comparison of Equation (6) with Equation (7), the present embodiment can allow the blade width Mw2 of the punching die to be greater than the blade width Mw1 in the conventional example by 0.08 mm. However, it is also acceptable to limit the blade width increase to 0.04 mm, for example, and increase the tolerance in alignment from ±30 μm to ±50 μm. In the latter case, it is possible to increase a margin of alignment accuracy in positioning the blade with respect to the dam bar 1A, 1B and eventually reduce the manufacturing cost.

Although, in the aforementioned embodiment, the dam bars 1A and 1B are arranged only in two positions of the first and second positions in the direction in which the outer leads extend, it is also acceptable to provide three or more outer lead offset portions in a staggered form to provide alternate dam bars in the three or more positions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A lead frame for a semiconductor integrated circuit, comprising:

a chip mounting section for carrying a semiconductor chip, said semiconductor chip being sealed by a sealing resin when mounted on said chip mounting section;

a plurality of outer leads juxtaposed with each other in a peripheral section of the lead frame, said outer leads extending outwardly from said chip mounting section and adapted to be electrically connected with said semiconductor chip, wherein each outer lead has a first offset portion which is spaced more from a first adjacent outer lead on one side thereof than from a second adjacent outer lead on the other side thereof and a second offset portion which is spaced more from the second adjacent outer lead than from the first adjacent outer lead, said first and second offset portions of each outer lead being arranged in a staggered pattern; and dam bars interposed between the adjacent outer leads in a manner connecting each outer lead with the first adjacent outer lead at the first offset portion thereof and with the second adjacent outer lead at the second offset portion thereof for damming off the sealing resin that flows over said chip mounting section when the semiconductor chip is sealed.

2. The lead frame as claimed in claim 1, wherein the first offset portion of each outer lead is opposed to the second offset portions of the first and second adjacent outer leads on both sides thereof and the second offset portion of each outer lead is opposed to the first offset portions of the first and second adjacent outer leads.

3. A lead frame as in claim 1, wherein said leads have minimum distances between adjacent leads and maximum distances between adjacent leads and wherein said dam bars are disposed only at locations of maximum distances between two adjacent leads.

4. A lead frame for a semiconductor chip comprising a chip mounting section, a plurality of leads extending outwardly from at least one edge of said mounting section, said plurality of leads being formed into a first group and a second group wherein the leads of the first group are separated from each other by leads of the second group, said first group of leads extending in the outward direction having rightwardly extending portions followed by leftwardly extending portions, said second group of leads extending in an outward direction having leftwardly extending portions followed by rightwardly extending portions whereby there are maximum distances and minimum distances between adjacent leads and dam bars disposed at the location of maximum distances between adjacent leads.

* * * * *